US009017446B2

United States Patent
Zhang et al.

(10) Patent No.: US 9,017,446 B2
(45) Date of Patent: Apr. 28, 2015

(54) MIXED ALLOY SOLDER PASTE

(75) Inventors: Hongwen Zhang, New Hartford, NY (US); Ning-Cheng Lee, New Hartford, NY (US)

(73) Assignee: Indium Corporation, Clinton, NY (US)

( * ) Notice: Subject to any disclaimer, the term of this patent is extended or adjusted under 35 U.S.C. 154(b) by 254 days.

(21) Appl. No.: 12/772,897

(22) Filed: May 3, 2010

(65) Prior Publication Data

US 2011/0268985 A1  Nov. 3, 2011

(51) Int. Cl.
*B23K 35/26* (2006.01)
*B23K 35/02* (2006.01)
(Continued)

(52) U.S. Cl.
CPC ............... *B23K 35/025* (2013.01); *B23K 35/26* (2013.01); *B23K 35/0244* (2013.01); *B23K 35/262* (2013.01); *B23K 35/264* (2013.01); *B23K 35/362* (2013.01); *H01L 24/27* (2013.01); *H01L 24/29* (2013.01); *H01L 24/83* (2013.01); *H01L 2224/838* (2013.01); *H01L 2924/01012* (2013.01); *H01L 2924/01013* (2013.01); *H01L 2924/01025* (2013.01); *H01L 2924/01029* (2013.01); *H01L 2924/0103* (2013.01); *H01L 2924/01032* (2013.01); *H01L 2924/01046* (2013.01); *H01L 2924/01047* (2013.01); *H01L 2924/01049* (2013.01); *H01L 2924/0105* (2013.01); *H01L 2924/01051* (2013.01); *H01L 2924/01078* (2013.01); *H01L 2924/01079* (2013.01); *H01L 2924/01082* (2013.01); *H01L 2924/01327* (2013.01); *H05K 3/3484* (2013.01); *H01L 2224/29* (2013.01); *H01L 2224/29298* (2013.01); *H01L 2924/01005* (2013.01); *H01L 2924/01006* (2013.01); *H01L 2924/01033* (2013.01); *H01L 2924/01074* (2013.01); *H01L 2924/01075* (2013.01); *H01L 2924/01322* (2013.01); *H01L 2924/014* (2013.01); *H01L 2224/29101* (2013.01); *H01L 2924/0132* (2013.01); *H01L 2924/0133* (2013.01); *H01L 2224/29109* (2013.01);
(Continued)

(58) Field of Classification Search
USPC ........ 75/255, 252; 148/513, 516–537, 22–26, 148/400; 420/557–562, 577
See application file for complete search history.

(56) References Cited

U.S. PATENT DOCUMENTS

2009/0301607 A1*  12/2009  Nakano et al. ................. 148/24

FOREIGN PATENT DOCUMENTS

CN           101351296      11/2009
EP           1952934        8/2008
(Continued)

OTHER PUBLICATIONS

"Soldering: Solder Alloys," Metals Handbook, ASM International, 2002 (10 pages front matter, 6 pages of article 6).*
(Continued)

*Primary Examiner* — Scott Kastler
*Assistant Examiner* — Vanessa Luk
(74) *Attorney, Agent, or Firm* — Sheppard Mullin Richter & Hampton LLP

(57) ABSTRACT

A solder paste comprises an amount of a first solder alloy powder between about 60 wt % to about 92 wt %; an amount of a second solder alloy powder greater than 0 wt % and less than about 12 wt %; and a flux; wherein the first solder alloy powder comprises a first solder alloy that has a solidus temperature above about 260° C.; and wherein the second solder alloy powder comprises a second solder alloy that has a solidus temperature that is less than about 250° C.

27 Claims, 8 Drawing Sheets

(51) Int. Cl.
*B23K 35/362* (2006.01)
*H01L 23/00* (2006.01)
*H05K 3/34* (2006.01)

(52) U.S. Cl.
CPC .............. *H01L 2224/29111* (2013.01); *H01L 2224/29105* (2013.01); *H01L 2224/27505* (2013.01); *H01L 2924/00013* (2013.01); *H01L 2924/10253* (2013.01)

(56) References Cited

FOREIGN PATENT DOCUMENTS

| | | | | |
|---|---|---|---|---|
| JP | 11186712 | 7/1999 | | |
| JP | 11347784 | 12/1999 | | |
| JP | 2003211289 | 7/2003 | | |
| WO | WO 2007/055308 | * 5/2007 | ............ | B23K 35/14 |
| WO | 2008056676 | 5/2008 | | |

OTHER PUBLICATIONS

B. Predel, "Ag—Bi Phase diagram," Phase Equilibria, Crystallographic and Thermodynamic Data of Binary Alloys: Electronic Materials and Semiconductors, Group IV: Physical Chemistry, vol. 5, Springer, 1998, pp. 1-5.*
China First Office Action, App. No. 201180022297.6, mailed Jun. 10, 2014, Title: Mixed Allow Solder Paste, Applicant: Indium Corporation.

* cited by examiner

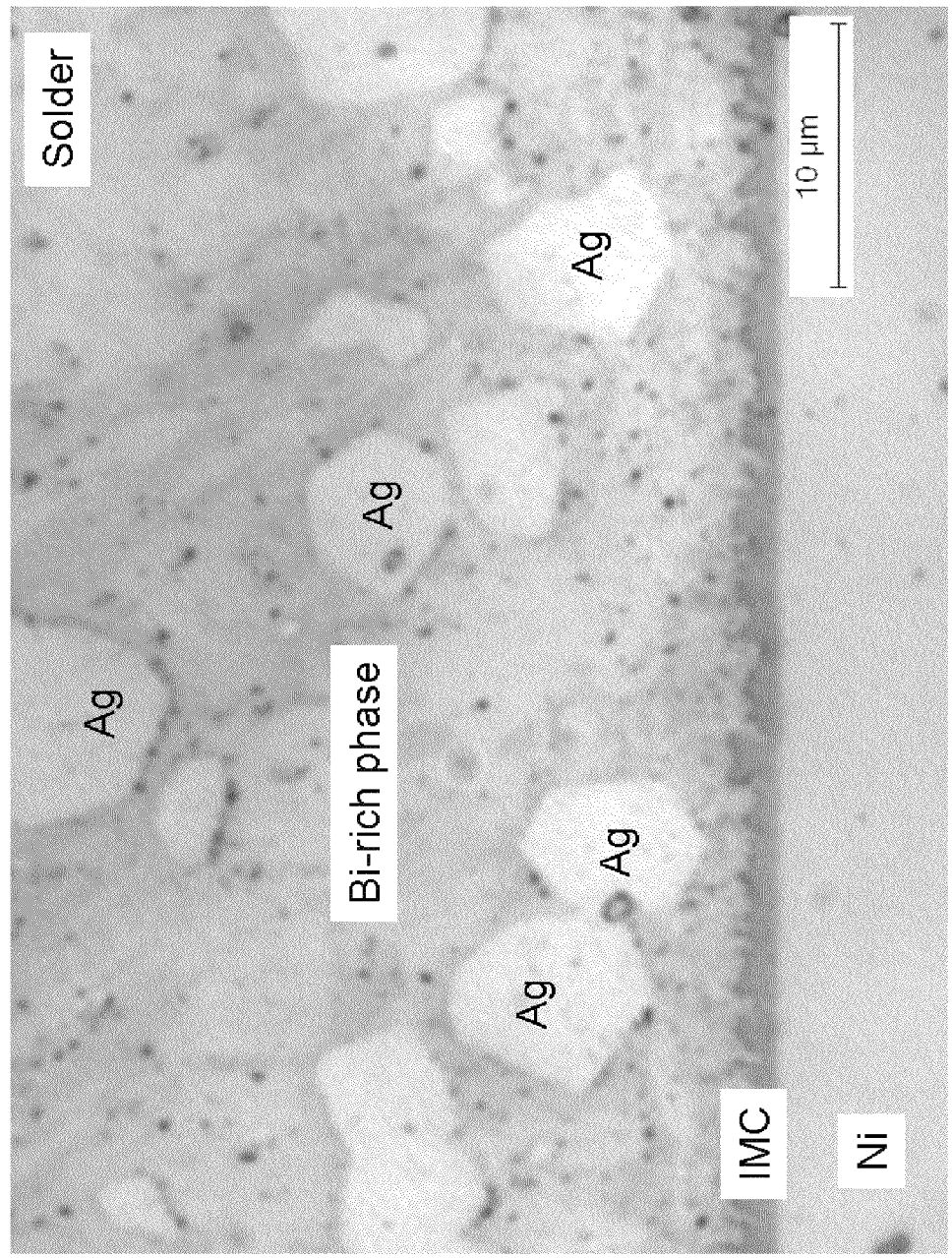

MIXED ALLOY SOLDER PASTE

TECHNICAL FIELD

The present invention relates generally to solder compositions, and more particularly, some embodiments relate to solder compositions for high temperature solder joint applications.

DESCRIPTION OF THE RELATED ART

Lead generated by disposal of electronic assemblies is considered hazardous to the environment and human health. Regulations increasingly prohibit the use of Pb-bearing solders in the electronic interconnection and the electronic packaging industries. Pb-free solders to replace the traditional eutectic Pb—Sn have been widely investigated. SnAg, SnCu, SnAgCu and SnZn solders are becoming the mainstream solders for interconnection in the semiconductor and electronics industries. However, the development of high temperature Pb-free solders to substitute the conventional high lead ones, i.e. Pb-5Sn & Pb-5Sn-2.5Ag, is still in its infancy. High temperature solders are used to keep the internal connection within the components in an assembly when the assembly is being soldered onto a printed wiring board (PWB).

A common use of high temperature solder is for die-attach. In an example process, the assembly is formed by soldering a silicon die onto a lead-frame using the high temperature solder. Then, the silicon die/lead-frame assembly, either encapsulated or not, is attached onto PWB by soldering or mechanical fastening. The board may be exposed to a few more reflow processes for surface mounting other electronic devices onto the board. During the further soldering processes, the internal connection between the silicon die and the lead-frame should be well maintained. This requires that the high temperature solder resist the multiple reflows without any functional failure. Accordingly, in order to be compatible with solder reflow profiles used in the industry, the major requirements for the high temperature solders include (i) a melting temperature around 260° C. and above (in accordance with typical solder reflow profiles), (ii) good thermal fatigue resistance, (iii) the high thermal/electric conductivity, and (iv) low cost.

Currently, there are no drop-in lead-free alternatives available in the industries. However, a few lead-free solder candidates have been proposed recently for the high temperature die-attach applications, such as (1) Sn—Sb, (2) Zn-based alloys, (3) Au—Sn/Si/Ge and (4) Bi—Ag.

Sn—Sb alloys, with less than 10 wt % Sb, maintain good mechanical properties without forming massive intermetallic compounds. But their solidus temperature is no higher than 250° C., which can not satisfy the 260° C. requirement for reflow resistance.

Zn-based alloys, including eutectic Zn—Al, Zn—Al—Mg, and Zn—Al—Cu, have melting temperature above 330° C. However, the high affinity of Zn, Al, and Mg to oxygen causes extremely poor wetting on various metallization surface finishes. Zn-(20-40 wt %)Sn solder alloys, proposed to be one of the high temperature lead-free substitute solder, have liquidus temperature above 300° C., but the solidus temperature is only around 200° C. The semi-solid state of Zn—Sn solder at around 260° C. is supposed to maintain a good interconnection between the components during subsequent reflows. However, problems arise when the semi-solid solder is compressed inside an encapsulated package and forces the semi-solid solder to flow out. This creates a risk of unexpected functional failure. Zn-based solder alloys will also form massive IMC layers between the metallization surface and the solder. The existence of the IMC layer and its intensive growth during the subsequent reflow and operation also causes reliability concerns.

Eutectic Au—Sn, composed of two intermetallic compounds, has been experimentally shown to be a reliable high temperature solder because of its melting temperature of 280° C., good mechanical properties, high electrical & thermal conductivities, and excellent corrosion resistance. However, extremely high cost restricts its application within the fields where cost overcomes reliability considerations.

Bi—Ag alloys with solidus temperature of 262° C. satisfy the melting temperature requirement for high temperature die-attach solders. However, there are a few major concerns: (1) poor wetting on various surface finishes and (2) the associated weak bonding interface originating from the poor wetting.

The melting temperature requirement for high melting lead-free solders makes Sn—Sb and Zn—Sn solders unsuitable. The extremely high cost of Au rich solders limits their acceptance by the industry. Zn—Al and Bi—Ag meet the melting temperature requirement and are reasonably low-cost. However, their poor wetting, due to high affinity to oxygen (in the Zn—Al solder system) or due to poor reaction chemistry between the solder and the substrate metallization (in the Bi—Ag solder system or even some lead-containing solders such as the Pb—Cu and Pb—Ag systems), makes these high melting solders hard to use in the industry because of the weak bonding strength resulting from the poor wetting. However, the desired high melting temperature of BiAg and ZnAl still make them eligible as candidates for the high temperature lead-free solders.

As described above, the poor wetting of a solder originates from (1) poor reaction chemistry or (2) the oxidation of the solder. Weak bonding is always associated with the poor wetting. For example, the poor wetting of Bi-based solder on different metallization surfaces results mainly from the poor reaction chemistry between Bi and the substrate materials (i.e. Cu) or the oxidation of Bi during reflow. Ge-doped BiAg aimed at preventing the excessive formation of dross on alloy surface during melting have been developed. However, this doping will not change the reaction chemistry between Bi and the metallization surface finish of the substrate. Bi and Cu will not form IMCs at a Bi/Cu interface, which is the dominant reason for the poor wetting and the weak bonding interface. Bi and Ni will form IMC layer between a Bi/Ni interface, but the brittle IMCs (Bi3Ni or BiNi) weaken the joint strength because cracks always grow along either the interface between Bi3Ni and the solder matrix or the interface between BiNi and the Ni substrate. Accordingly, the reaction chemistry between Bi and substrate materials result in the poor wetting and the weak bonding strength.

Attempts have been made to modify the reaction chemistry between solder alloy and the metallization surface finish by alloying additional elements in the solder. However, alloying is normally associated with some unexpected property loss. For example, Sn has a better reaction chemistry with substrates than comparing to Bi. However, directly alloying Sn into BiAg (where the Ag is aimed at increasing the thermal/electrical conductivity) could cause (1) significant decrease in the melting temperature or (2) the formation of Ag3Sn IMC in the alloy. This will not improve the reaction chemistry between Sn with substrate metals if there is no enough time for them to be dissolved in the molten solder during reflow.

Thus, alloying elements directly into solder, such as Sn directly into Bi—Ag alloys, reveal minimal improvements.

BRIEF SUMMARY OF EMBODIMENTS OF THE INVENTION

The present invention claims a new technology for designing and preparing mixed alloy solder pastes, which deliver the combined merits from the constituent alloy powders. In some embodiments, the mixed alloy solder pastes are suitable for high-temperature solder applications such as die attach because the constituents provide the desired merits including improved reaction chemistry, well-controlled IMC layer thickness, and the enhanced reliability accordingly from the second alloy and the high melting temperature and good thermal/electrical conductivity from the first alloy. The invention also presents the method of preparing the mixed alloy solder pastes and the methodology of joining the electronic components or mechanical parts with the mixed alloy solder pastes.

The invented technology provides a method of designing mixed alloy powder pastes, in which the additive powders are present in the paste to improve the reaction chemistry at a relatively lower temperature or together with the melting of the first alloy solder powders. In some embodiments, the mixed alloy powder pastes include two or more alloy powders and a flux. The alloy powders in the paste are composed of one solder alloy powder as a majority and an additive alloy powder as a minority. The additives provide the superior chemistry to wet on various metallization surface finishes of the substrates, namely the commonly used Cu and Ni surface finishes, etc.

In some embodiments, the additives will melt before or together with the melting of the majority solder. The molten additives will wet on and adhere to the substrate before or together with the partially or completely molten first alloy. The additives are designed to dominate the formation of IMCs along the substrate metallization surface finish and be completely converted into IMCs during the reflow process. The thickness of the IMC layer will thus be well controlled by the quantity of the additives in the paste because of the dominant roles the additives play in the IMC formation. In some embodiments, the first alloy solder will have a strong affinity to the IMC layer formed between the additives and the substrate. This strong affinity will enhance the bonding strength between the solder body and the IMCs. Thus, the desired reaction chemistry and the well controlled thickness of the IMC layer not only improves the wetting performance but also enhances the bonding strength associated with the wetting performance.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed towards solder pastes comprising mixtures of different solder alloys in flux. Two or more solder alloys or metals are incorporated into a flux material. A first solder alloy or metal (the "first alloy") will form the main body of the solder joint during reflow. The remaining second solder alloy or metal, or further additional solder alloys or metals, (the "second alloy") is selected according to reaction chemistry with the metal substrate or affinity to the first alloy. The second alloy's melting temperature Tm(B) is lower than the first alloy's melting temperature Tm(A). During reflow, the second alloy melts first, and spreads onto the substrate. When the first alloy melts, the presence of the second alloy facilitates the setting of the molten first alloy on the substrate. The second alloy is designed to be completely converted into IMCs, resulting in minimal or absent low-melting phase in the final joint.

The additives in the pastes modify the reaction chemistry during reflow, improve the wetting, control the thickness of IMCs, and thus enhance the bonding strength. In addition to solders for high temperature lead-free soldering with the desired wetting and the reliability, the design process can be extended into many other soldering applications wherever a poor wetting solder is in use. For example, Pb—Cu alloys have a high melting temperature but poor wetting on various metal substrates. Thus, they are difficult to use in soldering. With the current invention, small additives, such as Sn or Sn-containing alloys, will help Pb—Cu to wet various metal surfaces. However, if the Sn were merely alloyed in Pb—Cu, the Cu6Sn5 IMC formation would decrease the reaction chemistry from Sn. Alloying higher amounts of Sn in the solder will significantly decrease the melting temperature of Pb—Cu, which is undesired.

Figure 1:
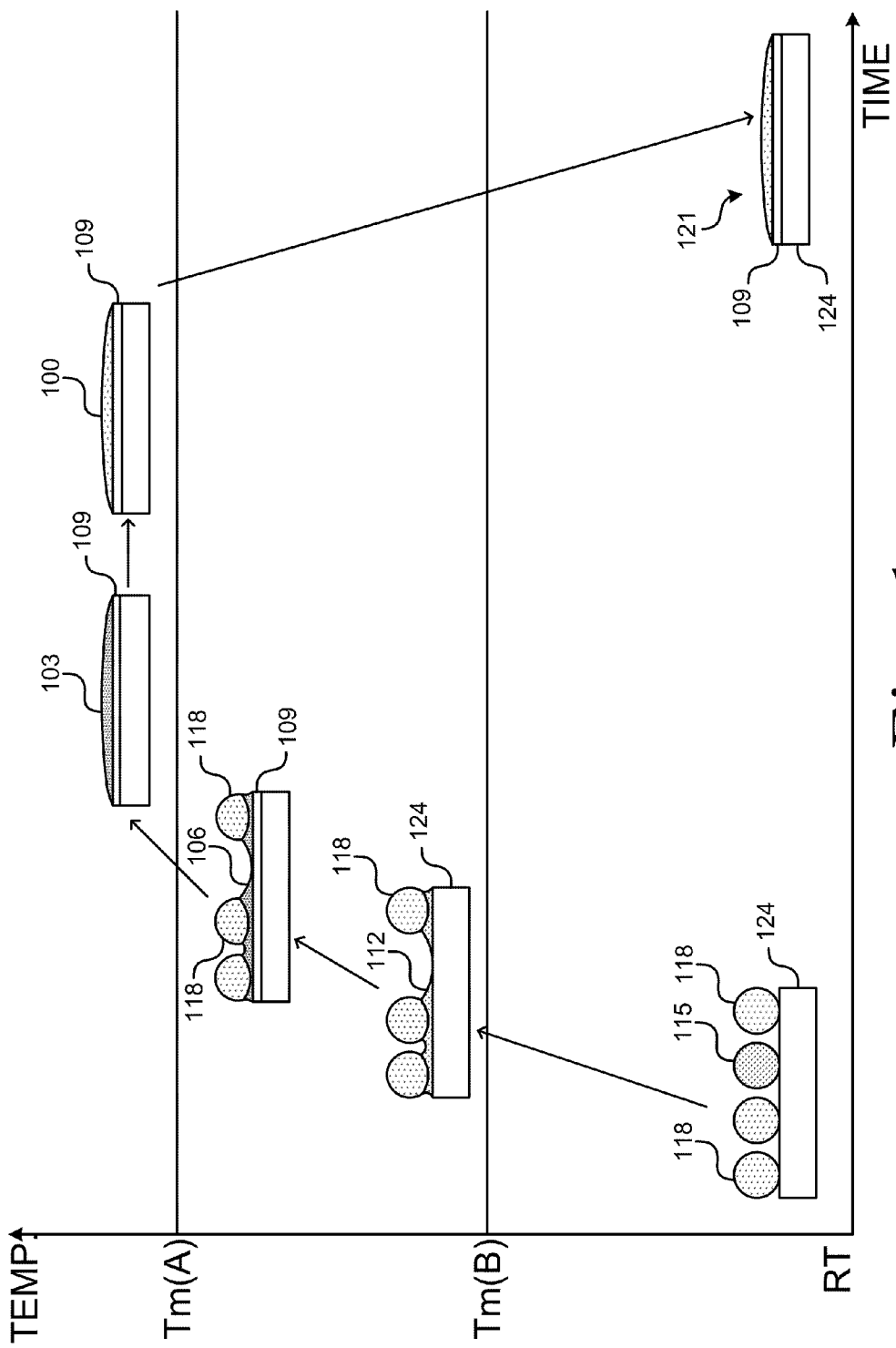
FIG. 1 illustrates a reflow solder process implemented in accordance with an embodiment of the invention.

FIG. 1 illustrates a reflow process using a mixed solder paste according to an embodiment of the invention. The mixed solder paste comprises first alloy solder particles 118 and second alloy solder particles 115 suspended in a flux. In some embodiments, the second alloy is selected according to its superior reaction chemistry to the substrate, or to a range of common substrates. The mixed solder paste is applied to a substrate 124. (For sake of explanation, the flux is omitted from the figure.)

During reflow, the temperature of the assembly rises above the second alloy's melting temperature, Tm(B). The second alloy melts and spreads 112 over the substrate 124 and around the still-solid first alloy particles 118. The superior surface reaction chemistry of the second alloy will facilitate the wetting of the molten solder alloy 112 on the substrate 124. This leads to the formation of IMC layer 109 between the molten second alloy 112 and the substrate 124. Accordingly, the IMC layer is mainly controlled by the quantity of the second alloy 115 in the initial paste.

Additionally, the second alloy is designed to have a good affinity to the first alloy. This affinity may be determined by (1) the negative mixing enthalpy between the first alloy and the second alloy, or (2) the formation of a eutectic phase composed of the constituent elements from the first and second alloys. In some embodiments, this affinity results in some of the first alloy 118 dissolving into the molten second alloy 112 to form a mixture 106 of the first and second alloys.

As the temperature rises above the first alloy's melting temperature, Tm(A), the first alloy finishes melting, forming a solution 103 of the first and second alloys, which wets to the IMC layer 109. As the assembly is maintained above Tm(A), the second alloy is removed from the solution 103, increasing the IMC layer 109, and leaving the molten first alloy 100. In some embodiments, in addition to forming the IMC layer 109, excess constituents from the second alloy may be incorporated into IMC with constituents from the first alloy. The affinity between the first alloy and the second alloy assists in improving the wetting of the first alloy 100 onto the IMC layer 109, thereby enhancing the bonding strength.

As the assembly is cooled, a solder bump 121 or joint is formed of the substrate 124 bonded to the IMC 109, which is bonded to the solidified first alloy. After solidification, a homogenous solder joint with the improved bonding interface has been achieved.

Figure 2:
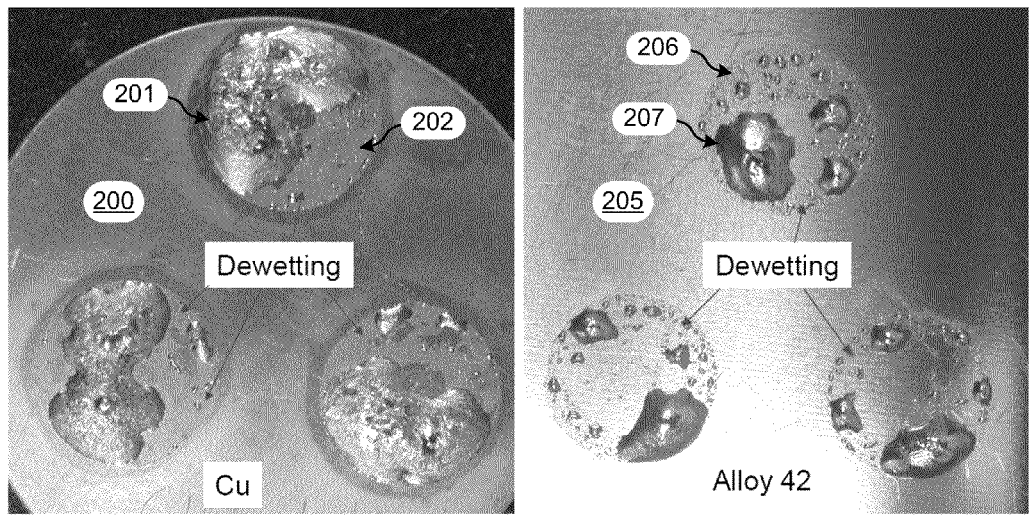
FIG. 2 shows the wetting performance of an example solder paste consisting of 90 wt % Bi10.02Ag3.74Sn+10 wt % flux on a Cu coupon and an Alloy 42 coupon.
Figure 3:
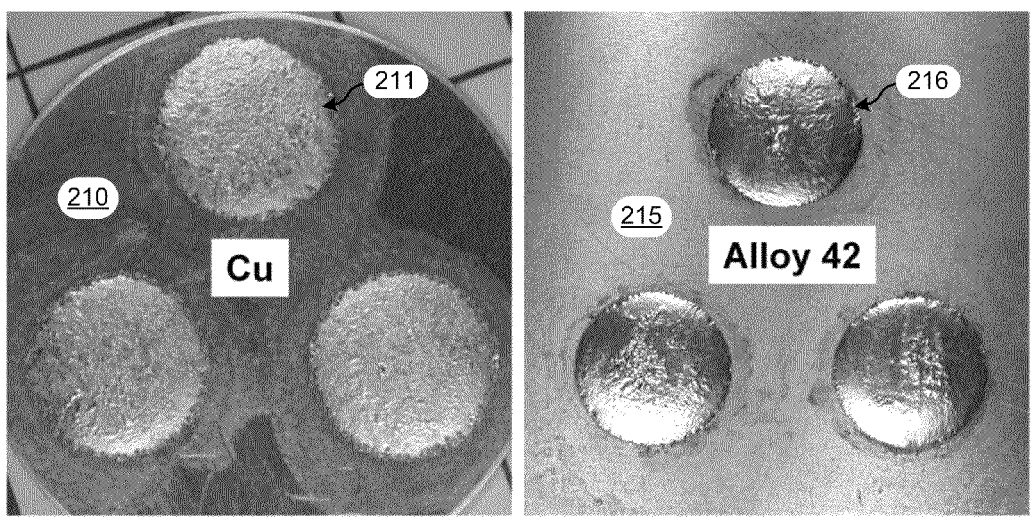
FIG. 3 shows the wetting performance of an example of the mixed alloy powder solder paste consisting of 84 wt % Bi11Ag+6 wt % Bi42Sn+10 wt % flux on a Cu coupon and an Alloy 42 coupon.

The solder joint resulting from use of the mixed solder paste shows large improvements of the use of a solder paste containing a single solder alloy, even when the single solder alloy is composed of the elements of the first and second solder alloys. FIG. 2 illustrates solder bumps 201 and 207 formed using a solder paste consisting of 90 wt % Bi10.02Ag3.74Sn+10 wt % flux on a Cu substrate 200 and an Alloy 42 substrate 205, respectively. As these results show, significant dewetting 202 and 206 occurs with the use of a single solder alloy. In contrast FIG. 3 illustrates solder bumps 211 and 216 formed using a mixed solder paste consisting of 84 wt % Bi11Ag+6 wt % Bi42Sn+10 wt % flux on a Cu substrate 210 and an Alloy 42 substrate 215, respectively. As these results show, the use of a mixed solder paste shows little to no visible dewetting.

In one embodiment, the mixed solder paste comprises BiAg as the first alloy and SnSb as the second alloy. In the second alloy, Sn is chosen for its superior reaction chemistries over Bi with various substrates. SnSb has a lower melting temperature than BiAg. Sn and Bi exhibit a negative mixing enthalpy and form the eutectic phase in a wide composition range, according to the binary phase diagram. Sb and Bi also show a negative mixing enthalpy and infinite solubility to each other. During reflow, SnSb melts first and forms a Sn-containing IMC layer on the substrate surface. When the temperature reaches above the melting temperature of BiAg, all alloy powders in the paste melt. The good affinity between Bi and Sn/Sb guarantees good adhesion of molten Bi on the Sn-containing IMC layer. Additionally, the existence of Ag in the first alloy can convert any extra Sn into Ag3Sn 1MCs residing in the solder body. Therefore, there is minimal or no low melting BiSn phase left because Sn is completely consumed by forming (1) IMC layer between the solder and the metal substrate and (2) Ag3Sn inside the BiAg solder bump.

Figure 5:
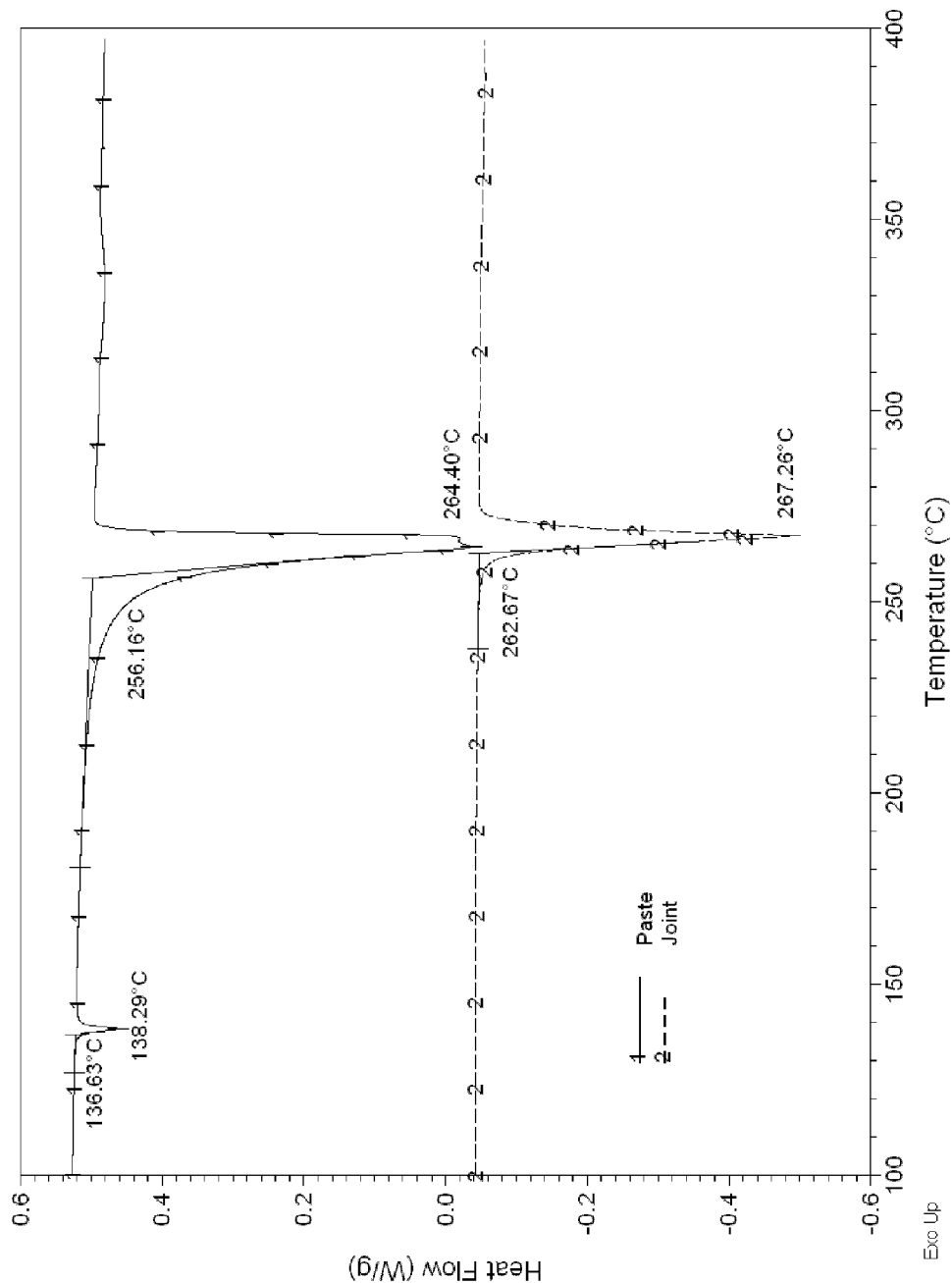
FIG. 5 is a DSC chart for a mixed alloy powder solder paste consisting of 84 wt % Bi11Ag+6 wt % Sn15Sb+10 wt % flux.
Figure 6:
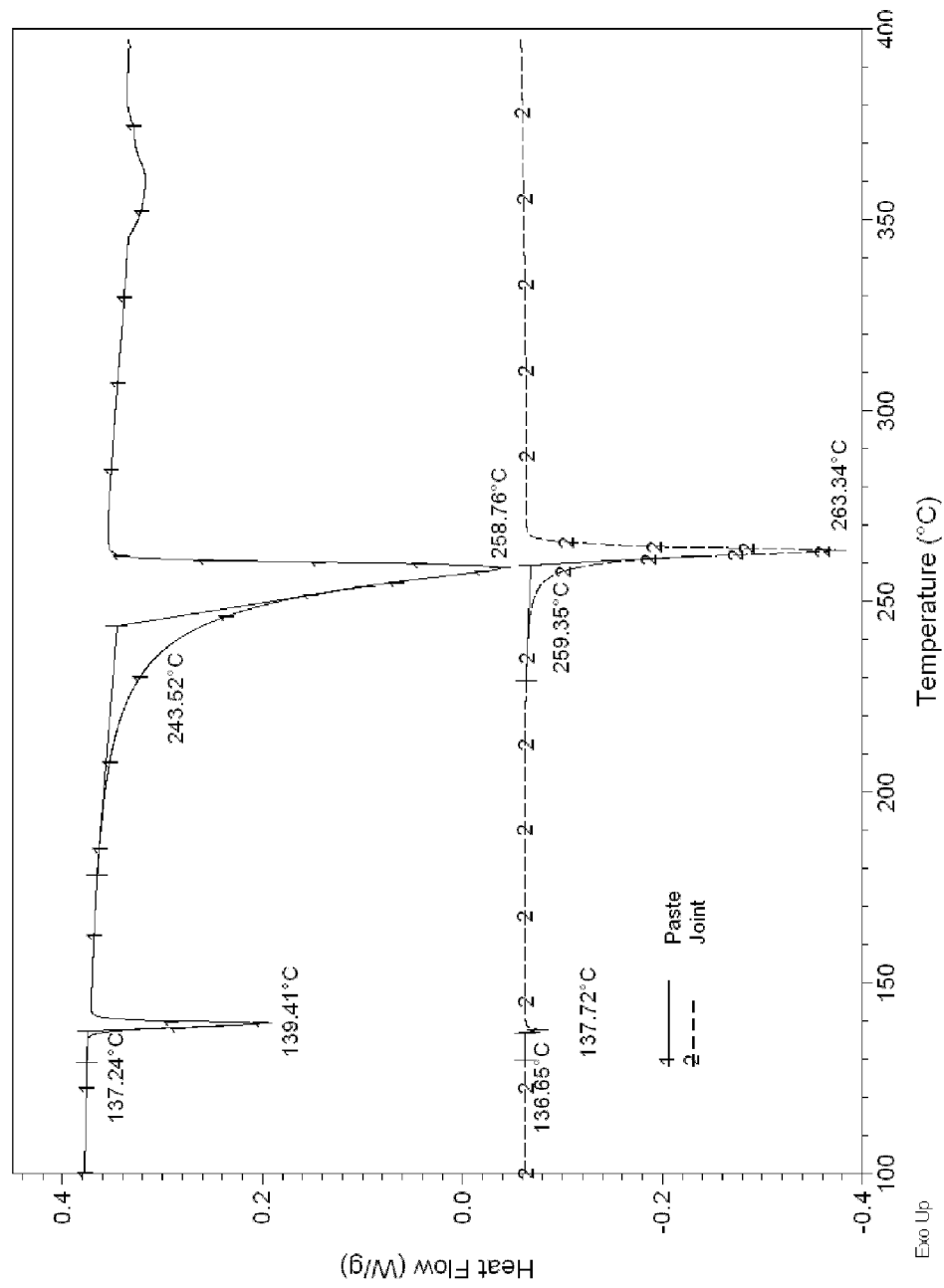
FIG. 6 is a DSC chart for a mixed alloy powder solder paste consisting of 84 wt % Bi11Ag+6 wt % Sn3.5Ag+10 wt % flux.
Figure 7:
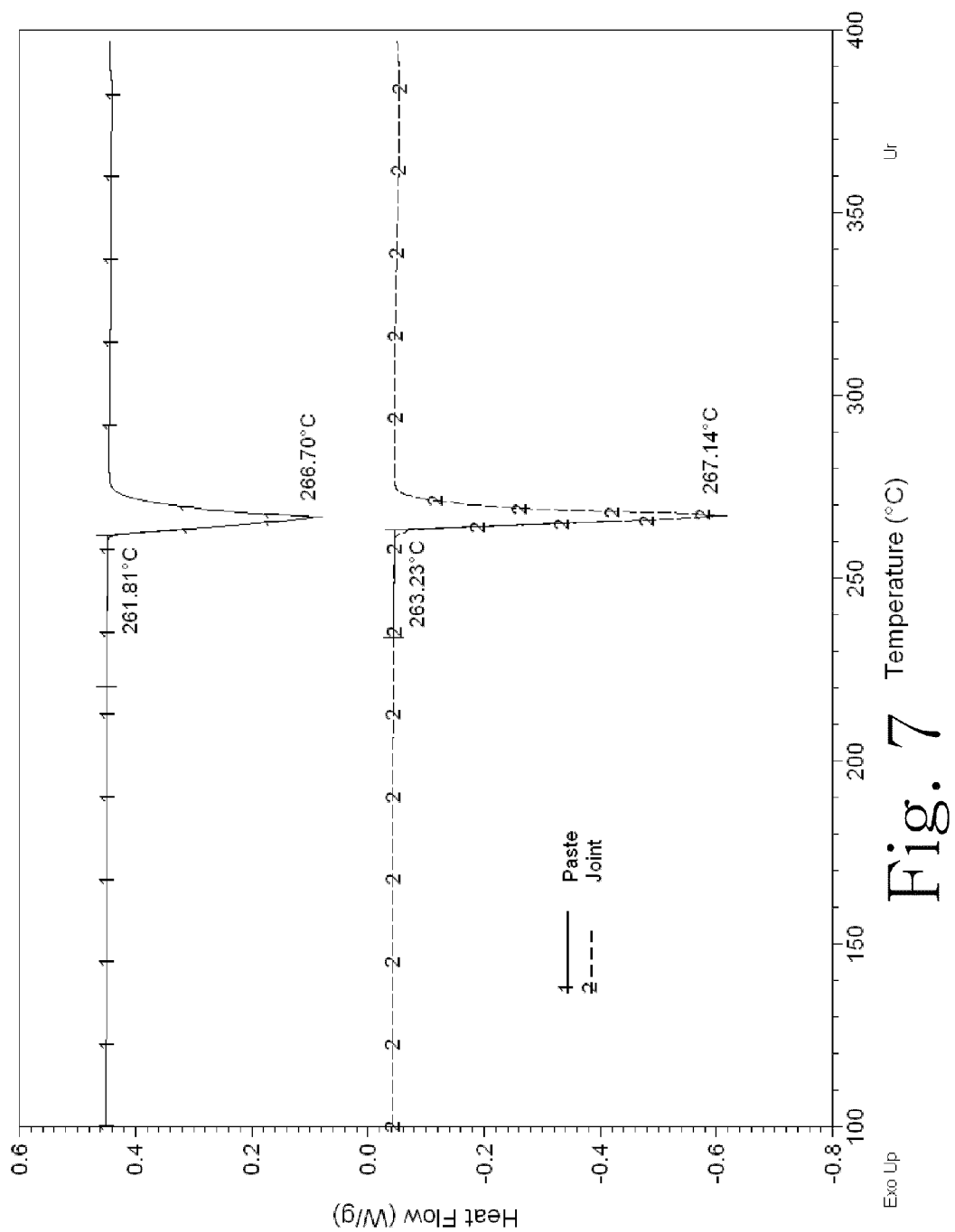
FIG. 7 is a DSC chart for a mixed alloy powder solder paste consisting of 84 wt % Bi11Ag+6 wt % Bi42Sn+10 wt % flux.

FIG. 5 illustrates a DSC curve for the joint resulting from the use of 84 wt % Bi11Ag+6 wt % Sn15Sb+10 wt % flux. The top curve illustrates the heat flow profile after reflow on a ceramic coupon. A spike at around 138° C. illustrates the presence of the second alloy. The bottom curve illustrates the heat flow profile of the paste after reflow on a Cu coupon. The absence of this spike in the bottom curve verifies the disappearance of the low melting phase in the BiAg+SnSb system. FIG. 6 illustrates the disappearance of the low melting phase in the BiAg+SnAg system. The experiment of FIG. 6 used 84 wt % Bi11Ag+6 wt % Sn3.5Ag+10 wt % flux on ceramic and Cu coupons, as in FIG. 5. FIG. 7 illustrates the disappearance in the BiAg+BiSn system. The experiment of FIG. 7 used 84 wt % Bi11Ag+6 wt % Bi42Sn+10 wt % flux on ceramic and Cu coupons, as in FIGS. 5 and 6. In FIG. 7, the top curve, illustrating the heat flow profile after solder reflow on ceramic shows a lack of low melting phase. This is likely due the small quantity of the reactive agent, Sn, in the mixed solder paste and the high affinity between Sn and Ag, resulting in the Sn of the second alloy being incorporated with some Ag of the first alloy into 1MC in the final solder bump.

Figure 8A:
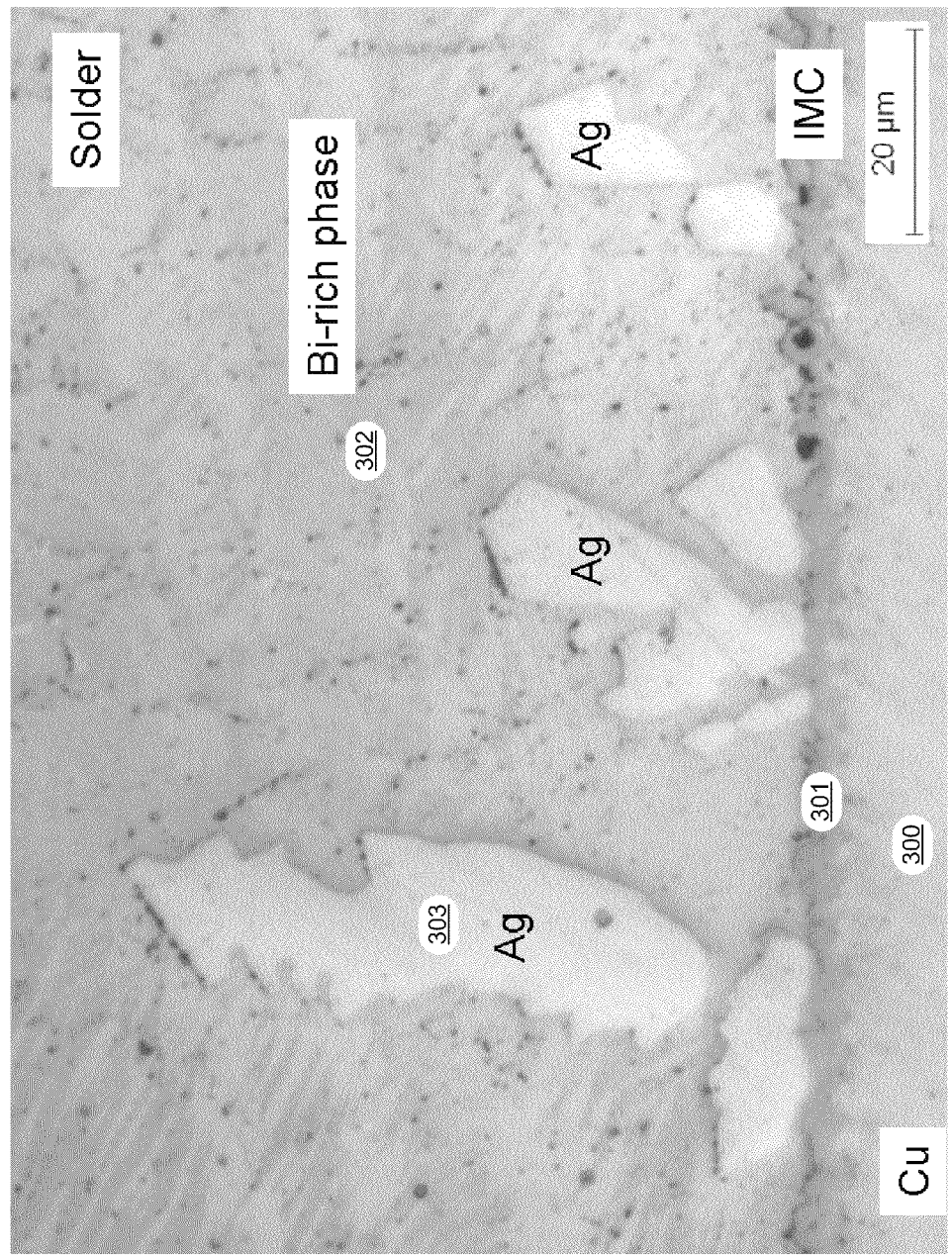
FIGS. 8A and B are cross-section images of the joints made of a mixed alloy powder solder paste on Cu and Ni coupons. The mixed alloy powder paste consists of 84 wt % Bi11Ag+6 wt % Sn3.5Ag+10 wt % flux.

FIG. 8A is a micrograph of a solder joint resulting from use of a mixed solder paste consisting 84 wt % Bi11Ag+6 wt % Sn3.5Ag+10 wt % flux. In this example, the mixed solder paste was applied to a Cu coupon 300. An IMC 301 forms between the Cu 300 and the second alloy. The size of this IMC 301 is dependent primarily on the amount of second alloy in the paste. In the illustrated example, 6 wt % of the second alloy Sn3.5Ag resulted in an IMC that is only a few microns thick. The bulk of the solder joint is made up of Ag 303 in a Bi-rich phase 302. Aging at 150° C. for 2 weeks did not significantly increase the IMC thickness. In contrast, Bi and Cu do not form intermetallics, so Bi11Ag alone forms a weak bond because no IMC layer is presented between the solder and substrate.

In one embodiment of the invention, a method of designing a mixed solder paste comprises selecting a first alloy according to a desired trait of a finished solder joint, and then selecting a second alloy according to applicable substrates and affinity with the selected first alloy. The relative amounts of the first alloy, second alloy, and flux may be determined according to factors such as desired IMC layer thickness, required application conditions, and reflow processes. The 1MC layer thickness is related to amount of second alloy in the solder paste, the reflow profile, and the aging conditions following application. Acceptable thicknesses of IMC layer may very with different application conditions and different IMC compositions. For example, for a Cu6Sn IMC layer, 10 microns may be about as thick as is acceptable.

As the amount of second alloy in the paste is increased, there may be low melting phase remaining gin the final joint. If the amount of second alloy is reduced in the solder paste, desired wetting performance may be difficult to achieve. As the amount of second alloy is reduced, good wetting requires the use of a larger total amount of paste printed or dispensed on the substrate. However, increasing the total amount of paste may interfere with the geometry constraints from the soldering packages.

For high temperature solder applications, the first alloy must be chosen from various high melting solder alloys. In some embodiments, Bi-rich alloys, whose solidus temperature is around 258° C. and above, i.e. Bi—Ag, Bi—Cu, and Bi—Ag—Cu, are used. The second alloys (or additives) are selected from the alloys that have shown superior chemistry to wet on and adhere to various metallization surface finishes and good affinity to the molten Bi.

In these embodiments, the second alloy will melt before or together with the Bi-rich alloys and then easily wet on and adhere to the substrate. Meanwhile, the good affinity between Bi and the second alloy will provide good wetting. Accordingly, Sn, Sn alloys, In and in alloys are chosen to be the second alloy. On basis of the melting temperature of the chosen second alloys, three groups have been categorized. Group A includes the additive alloys with the solidus temperature between around 230° C. and 250° C., i.e. Sn, Sn—Sb, Sn—Sb—X (X=Ag, Al, Au, Co, Cu, Ga, Ge, In, Mn, Ni, P, Pd, Pt and Zn) alloys etc. Group B contains the solder alloys with the solidus temperature between around 200° C. and 230° C., including Sn—Ag, Sn—Cu, Sn—Ag—X (X=Al, Au, Co, Cu, Ga, Ge, In, Mn, Ni, P, Pd, Pt, Sb and Zn) and Sn—Zn alloys etc. Group C has the solder alloys with solidus temperature lower than 200° C., i.e. Sn—Bi, Sn—In, Bi—In, In—Cu, In—Ag and In—Ag—X (X=Al, Au, Bi, Co, Cu, Ga, Ge, Mn, Ni, P, Pd, Pt, Sb, Sn and Zn) alloys etc. In these alloys, Sn is the reactive agent in the system.

In one embodiment of the invention, the first alloy is an alloy from the Bi—Ag system and has a solidus temperature around 260° C. and above. In a particular embodiment, the first alloy comprises from 0 to 20 wt % Ag with the remainder being Bi. In a further embodiment, the first alloy comprises from 2.6 to 15 wt % Ag with the remainder being Bi.

In a second embodiment of the invention, the first alloy is selected from the Bi—Cu system and has a solidus temperature around 270° C. and above. In a particular embodiment, the first alloy comprises from 0 to 5 wt % Cu with the remainder being Bi. In a further embodiment, the first alloy comprises from 0.2 to 1.5 wt % of Cu with the remainder being Bi.

In a third embodiment of the invention, the first alloy is selected from the Bi—Ag—Cu system and has a solidus temperature around 258° C. and above. In a particular embodiment, the first alloy comprises from 0 to 20 wt % Ag and from 0 to 5 wt % Cu with the remainder being Bi. In a further embodiment, the first alloy comprises from 2.6 to 15 wt % Ag, and from 0.2 to 1.5 wt % Cu with the remainder being Bi.

In a fourth embodiment of the invention, the second alloy is from the Sn—Sb system and has a solidus temperature between around 231° C. and around 250° C. In a particular embodiment, the second alloy comprises from 0 to 20 wt % Sb with the remainder of Sn. In a further embodiment, the second alloy comprises of from 0 to 15 wt % Sb with the remainder being Sn.

In a fifth embodiment of the invention, the second alloy comprises Sn—Sb—X (where X=Ag, Al, Au, Co, Cu, Ga, Ge, In, Mn, Ni, P, Pd, Pt and Zn) and has a solidus temperature between about 230° C. and about 250° C. In a particular embodiment, the second alloy comprises from 0 to 20 wt % Sb and from 0-20 wt % of X with the remainder being Sn. In a further embodiment, the second alloy comprises from 0 to 10 wt % Sb and from 0 to 5 wt % X with the remainder being Sn.

In a sixth embodiment of the invention, the second alloy comprises Sn—Ag and has a solidus temperature around 221° C. and above. In a particular embodiment the second alloy comprises from 0 to 10 wt % Ag with the remainder being Sn. In a further embodiment, the second alloy comprises from 0 to 5 wt % Ag with the remainder being Sn.

In a seventh embodiment of the invention, the second alloy comprises Sn—Cu and has a solidus temperature around 227° C. and above. In a particular embodiment, the second alloy comprises from 0 to 5 wt % Cu with the remainder being Sn. In a further embodiment, the second alloy comprises from 0 to 2 wt % Cu with the remainder being Sn.

In an eighth embodiment of the invention, the second alloy comprises Sn—Ag—X (where X=Al, Au, Co, Cu, Ga, Ge, In, Mn, Ni, P, Pd, Pt, Sb and Zn) and has a solidus temperature around 216° C. and above. In a particular embodiment, the second alloy comprises from 0 to 10 wt % Ag and from 0 to 20 wt % X with the remainder being Sn. In a further embodiment, the second alloy comprises from 0 to 5 wt % Ag and from 0 to 5 wt % X with the remainder being Sn.

In a ninth embodiment of the invention, the second alloy comprises Sn—Zn and has a solidus temperature around 200° C. and above. In a particular embodiment, the second alloy comprises from 0 to 20 wt % Zn with the remainder being Sn. In a further embodiment, the second alloy comprises from 0 to 9 wt % Zn with the remainder being Sn.

In a tenth embodiment of the invention, the second alloy comprises a Bi—Sn alloy with solidus temperature around 139° C. and above. In a particular embodiment, the second alloy comprises from 8 to 80 wt % Sn with the remainder being Bi. In a further embodiment, the second alloy comprises from 30 to 60 wt % Sn with the remainder being Bi.

In an eleventh embodiment of the invention, the second alloy comprises a Sn—In alloy with solidus temperature around 120° C. and above. In a particular embodiment, the second alloy comprises from 0 to 80 wt % In with the remainder being Sn. In a further embodiment, the second alloy comprises from 30 to 50 wt % In with the remainder being Sn.

In a twelfth embodiment of the invention, the second alloy comprises a Bi—In alloy with solidus temperature between around 100 and around 200° C. In a particular embodiment, the second alloy comprises from 0 to 50 wt % In with the remainder being Bi. In a particular embodiment, the second alloy comprises from 20 to 40 wt % In with the remainder being Bi.

In a thirteenth embodiment of the invention, the second alloy comprises an In—Cu alloy with solidus temperature between around 100 and around 200° C. In a particular embodiment, the second alloy comprises from 0 to 10 wt % Cu with the remainder being In. In a particular embodiment, the second alloy comprises from 0 to 5 wt % Cu with the remainder being In.

In a fourteenth embodiment of the invention, the second alloy comprises an In—Ag alloy with solidus temperature between around 100 and around 200° C. In a particular embodiment, the second alloy comprises from 0 to 30 wt % Ag with the remainder being In. In a further embodiment, the second alloy comprises from 0 to 10 wt % Ag with the remainder being In.

In a fifteenth embodiment, the second alloy is an In—Ag—X (X=Al, Au, Bi, Co, Cu, Ga, Ge, Mn, Ni, P, Pd, Pt, Sb, Sn and Zn) alloy with a solidus temperature between around 100 and around 200° C. In a further embodiment, the second alloy comprises from 0 to 20 wt % Ag, 0 to 20 wt % X with the remainder being In. In a particular embodiment, the second alloy comprises from 0 to 10 wt % Ag, 0 to 5 wt % X with the remainder being In.

Further embodiments of the invention provide methods for making mixed solder pastes. In some embodiments, particles of the first alloy are formed and particles of the second alloy are formed. The particles of the first and second alloys are then mixed with a flux to form a solder paste. The final paste comprises the first alloy powder, the second alloy powder, with the balance flux. In some embodiments, the first alloy particles are of an alloy having a solidus temperature of at least about 260° C. In further embodiments, the second alloy comprises an alloy having a solidus temperature between about 230° C. and about 250° C., an alloy having a solidus temperature between about 200° C. and about 230° C., or an alloy having a solidus temperature below about 200° C. In some embodiments, the paste is composed of between about 60 and about 92 wt % of the first alloy powder, an amount of the second alloy powder greater than 0% but less than or equal to about 12 wt %, with the balance being flux. In further embodiments, the second alloy powder is between 2 and 10 wt % of the mixed solder paste.

In a particular embodiment, the first alloy comprises a Bi—Ag alloy, a Bi—Cu alloy, or a Bi—Ag—Cu alloy. In a further embodiment, the alloy having a solidus temperature between about 230° C. and about 250° C. comprises an Sn alloy, a Sn—Sb alloy, or an Sn—Sb—X (where X=Ag, Al, Au, Co, Cu, Ga, Ge, In, Mn, Ni, P, Pd, Pt and Zn) alloy. In another embodiment, the alloy having a solidus temperature between about 200° C. and about 230° C. comprises a Sn—Ag alloy, a Sn—Cu alloy, a Sn—Ag—X (where X=Al, Au, Co, Cu, Ga, Ge, In, Mn, Ni, P, Pd, Pt, Sb and Zn) alloy, or a Sn—Zn alloy. In a still further embodiment, the alloy having a solidus temperature below about 200° C. comprises a Sn—Bi alloy, a Sn—In alloy, or a Bi—In alloy.

In further embodiments, the second alloy powder comprises a powder composed of a plurality of alloy powders. For example, the second alloy powder may comprise a mix of different alloys selected from the alloys described herein.

In some embodiments, the relative amounts of the first and second alloys in the mixed solder pastes are determined according to the solder application. In some cases, when the amount of second solder alloy in the paste is increased past a certain threshold, the chances of retaining some low melting phase in the final solder joint may be increased. In some cases, when the amount of second solder alloy in the paste is below a certain threshold, the wetting to substrate may be reduced. In one embodiment, the amount of second solder alloy in the paste is determined such that the low melting phase may be completely converted into high melting IMCs after reflow. In a further embodiment, the second alloy in the paste varies between an amount greater than 0 wt % but less than about 12 wt %. In a particular embodiment, the second alloy in paste is greater than about 2 wt % but less than about 10 wt %.

In addition to various normal impurities or small amounts of different elements, other elements may be added or incorporated in these alloys as long as the reactive properties of the Sn are maintained.

In some embodiments, the reflow profile used for soldering with a mixed solder paste is designed to heat up quickly to above the melting temperature of the first alloy. In these cases, a shorter soaking time at low temperature may allow the reactive agent, such as Sn, to flow quickly toward the substrate and react with the substrate in a completely melted pool rather than a semisolid melted pool. The melting of both first and second alloy will facilitate the diffusion of the second alloy elements from the molten solder towards the substrate and the part and "sink" onto the surface to form the IMC layer

EXAMPLE

Various mixed alloy powder solder pastes that span the ranges described herein, were tested for solder performance.

Table 1 describes formulations of example mixed solder pastes made using a first alloy comprising Bi11Ag or Bi2.6Ag, a second alloy comprising Sn10Ag25Sb or Sn10Ag10Sb, and flux.

TABLE 1

Weight percentages of mixed solder alloys using Group A second alloys

| Bi11Ag | Bi2.6Ag | Sn10Ag25Sb | Sn10Ag10Sb | Sn15Sb | Flux |
|--------|---------|------------|------------|--------|------|
| 80 wt % |        | 10 wt %    |            |        | 10 wt % |
| 82 wt % |        | 8 wt %     |            |        | 10 wt % |
| 84 wt % |        | 6 wt %     |            |        | 10 wt % |
| 86 wt % |        | 4 wt %     |            |        | 10 wt % |
| 42 wt % | 42 wt % | 6 wt %     |            |        | 10 wt % |
| 86 wt % |        |            | 4 wt %     |        | 10 wt % |
| 84 wt % |        |            |            | 6 wt % | 10 wt % |
| 86 wt % |        |            |            | 4 wt % | 10 wt % |

Table 2 describes formulations of example mixed solder pastes made using a first alloy comprising Bi11Ag, a second alloy comprising Sn3.8Ag0.7Cu, Sn3.5Ag, Sn0.7Cu, or Sn9Zn, and flux.

TABLE 2

Weight percentages of mixed solder alloys using Group B second alloys

| Bi11Ag | Sn3.8Ag0.7Cu | Sn3.5Ag | Sn0.7Cu | Sn9Zn | Flux |
|--------|--------------|---------|---------|-------|------|
| 84 wt % | 6 wt %      |         |         |       | 10 wt % |
| 86 wt % | 4 wt %      |         |         |       | 10 wt % |
| 84 wt % |              | 6 wt %  |         |       | 10 wt % |
| 86 wt % |              | 4 wt %  |         |       | 10 wt % |
| 84 wt % |              |         | 6 wt %  |       | 10 wt % |
| 86 wt % |              |         | 4 wt %  |       | 10 wt % |
| 84 wt % |              |         |         | 6 wt % | 10 wt % |
| 86 wt % |              |         |         | 4 wt % | 10 wt % |

Table 3 describes formulations of example mixed solder pastes made using a first alloy comprising Bi11Ag, a second alloy comprising Bi42Sn, Bi33In, or In48Sn, and flux.

TABLE 3

Weight percentages of mixed solder alloys using Group C second alloys

| Bi11Ag | Bi42Sn | Bi33In | In48Sn | Flux |
|--------|--------|--------|--------|------|
| 82 wt % | 8 wt % |        |        | 10 wt % |
| 84 wt % | 6 wt % |        |        | 10 wt % |
| 86 wt % | 4 wt % |        |        | 10 wt % |
| 82 wt % |        | 8 wt % |        | 10 wt % |
| 84 wt % |        | 6 wt % |        | 10 wt % |
| 86 wt % |        | 4 wt % |        | 10 wt % |
| 82 wt % |        |        | 8 wt % | 10 wt % |
| 84 wt % |        |        | 6 wt % | 10 wt % |
| 86 wt % |        |        | 4 wt % | 10 wt % |

Each paste described by Tables 1, 2, and 3, was prepared and printed onto a coupon using a three-hole stainless steel stencil. Cu, Ni, Alloy 42, and Alumina coupons were used. Each paste was printed onto each coupon. The holes were ¼ inch in diameter. The printed coupons were reflowed through a reflow oven with a profile designed for the mixed alloy powder solder pastes. The reflow was performed in a three-zone reflow oven, at 380° C., 400° C., and 420° C. at a belt speed of 13" per minute under an $N_2$ atmosphere.

Figure 4:
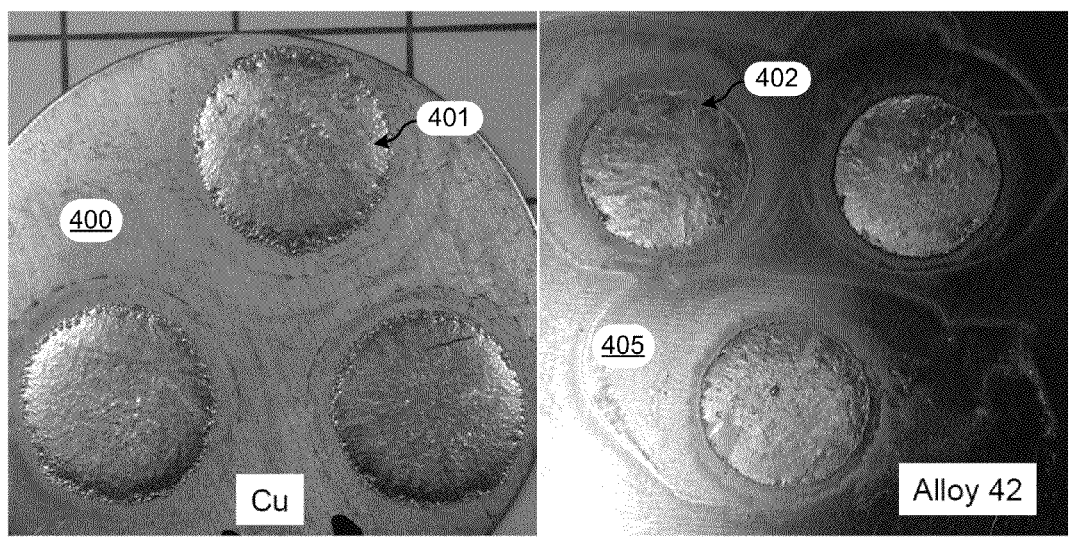
FIG. 4 shows the wetting performance of an example of the mixed alloy powder solder paste consisting of 84 wt % Bi11Ag+6 wt % 52In48Sn+10 wt % flux on a Cu coupon and an Alloy 42 coupon.

The wetting performance on the Cu and Ni coupons was visually inspected. All of the mixed solder alloys showed improved wetting when compared to a single BiAg solder paste. FIGS. 3 and 4 are pictures that are representative of typical results. FIG. 3 shows the wetting performance of an example of the mixed alloy powder solder paste consisting of 84 wt % Bi11Ag+6 wt % Bi42Sn+10 wt % flux. The left image shows the paste reflowed on a Cu coupon; the right image shows the paste reflowed on an Alloy 42 coupon. FIG. 4 shows the wetting performance of an example of the mixed alloy powder solder paste consisting of 84 wt % Bi11Ag+6 wt %52In48Sn+10 wt % flux. The left image shows the paste reflowed 401 on a Cu coupon 400; the right image shows the paste reflowed 402 on an Alloy 42 coupon 405.

The reflowed solder balls were peeled off from the alumina coupons for DSC testing. The solder bumps formed on the Cu coupons and Ni coupons were also punched off for DSC testing. DSC measurement was carried out using a differential scanning calorimeter at a heating rate of 10° C./min. The representative DSC curves are shown in FIGS. 5-7. FIG. 5 illustrates a DSC curve for the joint resulting from the use of 84 wt % Bi11Ag+6 wt % Sn15Sb+10 wt % flux. The top curve illustrates the heat flow profile after reflow on a ceramic coupon. A spike at around 138° C. illustrates the presence of the second alloy. The bottom curve illustrates the heat flow profile of the paste after reflow on a Cu coupon. The absence of this spike in the bottom curve verifies the disappearance of the low melting phase in the BiAg+SnSb system. FIG. 6 illustrates the disappearance of the low melting phase in the BiAg+SnAg system. The experiment of FIG. 6 used 84 wt % Bi11Ag+6 wt % Sn3.5Ag+10 wt % flux on ceramic and Cu coupons, as in FIG. 5. FIG. 7 illustrates the disappearance in the BiAg+BiSn system. The experiment of FIG. 7 used 84 wt % Bi11Ag+6 wt % Bi42Sn+10 wt % flux on ceramic and Cu coupons, as in FIGS. 5 and 6. In FIG. 7, the top curve, illustrating the heat flow profile after solder reflow on ceramic shows a lack of low melting phase. This is likely due to high affinity between Sn and Ag, resulting in the Sn of the second alloy being incorporated into IMC in the final solder bump.

Cross sections of samples were imaged to determine the IMC thickness at the interface between the solder bump and the Cu or Ni coupon. The representative images are shown in FIG. 8. FIG. 8a is a cross section of a solder bump using 84 wt % Bi11Ag+6 wt % Sn3.5Ag+10 wt % flux on a Cu coupon. FIG. 8b is a cross section of a solder bump using the same solder paste on a Ni coupon. As these results show, the IMC layer thickness was restricted to a few μm on both coupons.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:
1. A solder paste, consisting of:
an amount of a first solder alloy powder between about 60 wt % to about 92 wt %;
an amount of a second solder alloy powder greater than 0 wt % and less than about 12 wt %; and flux;
wherein the first solder alloy powder comprises a first solder alloy that has a solidus temperature above about 260° C.;
wherein the second solder alloy powder comprises a second solder alloy that has a solidus temperature that is less than about 250° C., the second solder alloy comprising a reactive component that reacts with a substrate to form an interfacial intermetallic compound layer; and
wherein, the reactive component is present in an amount such that, after reflow, the reactive component is completely consumed into the interfacial intermetallic compound layer, or is completely consumed into the interfacial intermetallic compound layer and one or more additional intermetallic compounds inside a joint, the one or more additional intermetallic compounds consisting of one or more components of the second solder alloy and one or more components of the first solder alloy.

2. The solder paste of claim 1, wherein the second solder alloy has a solidus temperature between about 230° C. and about 250° C.

3. The solder paste of claim 2, wherein the second solder alloy comprises a Sn alloy, a Sn—Sb alloy, or a Sn—Sb—X (where X=Ag, Al, Au, Co, Cu, Ga, Ge, In, Mn, Ni, P, Pd, Pt, or Zn) alloy.

4. The solder paste of claim 1, wherein the second solder alloy has a solidus temperature between about 200° C. and about 230° C.

5. The solder paste of claim 1, wherein the second solder alloy comprises a Sn—Ag alloy, a Sn—Cu alloy, a Sn—Ag—X (where X=Al, Au, Co, Cu, Ga, Ge, In, Mn, Ni, P, Pd, Pt, Sb, or Zn) alloy, or a Sn—Zn alloy.

6. The solder paste of claim 1, wherein the second solder alloy has a solidus temperature below about 200° C.

7. The solder paste of claim 6, wherein the second solder alloy comprises a Sn—Bi alloy, a Sn—In alloy, or a Bi—In alloy.

8. The solder paste of claim 1, wherein the amount of the second solder alloy powder is between about 2 wt % and 10 wt %.

9. The solder paste of claim 1, wherein the first solder alloy comprises a Bi—Ag, Bi—Cu, or Bi—Ag—Cu alloy.

10. The solder paste of claim 1, wherein the first solder alloy comprises from 0 to 20 wt % Ag with the remainder being Bi, from 0 to 5 wt % Cu with the remainder being Bi, or from 0 to 20 wt % Ag and from 0 to 5 wt % Cu, with the remainder being Bi.

11. The solder paste of claim 1, wherein the first solder alloy comprises from 2.6 to 15 wt % Ag with the remainder being Bi, from 0.2 to 1.5 wt % of Cu with the remainder being Bi, or from 2.6 to 15 wt % Ag, and from 0.2 to 1.5 wt % Cu with the remainder being Bi.

12. The solder paste of claim 1, wherein the second solder alloy further comprises a second component that has a negative mixing enthalpy with components of the first solder alloy.

13. The solder paste of claim 1, wherein the first solder alloy has a greater wettability to the interfacial intermetallic compound layer than the first solder alloy has to the substrate.

14. The solder paste of claim 1, wherein, during reflow, the interfacial intermetallic compound layer forms after the second solder starts to melt and before the formation of the one or more additional intermetallic compounds inside the joint.

15. The solder paste of claim 14, wherein, during reflow, the interfacial intermetallic layer continues to grow while the one or more additional intermetallic compounds form inside the joint after the first solder alloy starts to melt.

16. The solder paste of claim 1, wherein the second solder comprises a Sn—Sb—X alloy or a Sn—Ag—X alloy.

17. A method of making a solder paste, consisting of combining:
an amount of a first solder alloy powder between about 60 wt % to about 92 wt %; and
an amount of a second solder alloy powder greater than 0 wt % and less than about 12 wt %; with
flux;
wherein the first solder alloy powder comprises a first solder alloy that has a solidus temperature above about 260° C.; and
wherein the second solder alloy powder comprises a second solder alloy that has a solidus temperature that is less than about 250° C., the second solder alloy comprising a reactive component that reacts with a substrate to form an interfacial intermetallic compound layer; and
wherein, the reactive component is present in an amount such that, after reflow, the reactive component is completely consumed into the interfacial intermetallic compound layer, or is completely consumed into the interfacial intermetallic compound layer and one or more additional intermetallic compounds inside a joint, the one or more additional intermetallic compounds consisting of one or more components of the second solder alloy and one or more components of the first solder alloy.

18. The method of claim 17, wherein the second solder alloy comprises a Sn alloy, a Sn—Sb alloy, a Sn—Sb—X (where X=Ag, Al, Au, Co, Cu, Ga, Ge, In, Mn, Ni, P, Pd, Pt, or Zn) alloy, a Sn—Ag alloy, a Sn—Cu alloy, a Sn—Ag—X (where X=Al, Au, Co, Cu, Ga, Ge, In, Mn, Ni, P, Pd, Pt, Sb, or Zn) alloy, a Sn—Zn alloy, a Sn—Bi alloy, a Sn—In alloy, or a Bi—In alloy.

19. The method of claim 17, wherein the amount of the second solder alloy powder is between about 2 wt % and 10 wt %.

20. The method of claim 17, wherein the first solder alloy comprises a Bi—Ag, Bi—Cu, or Bi—Ag—Cu alloy.

21. The method of claim 17, wherein the first solder alloy comprises from 0 to 20 wt % Ag with the remainder being Bi, from 0 to 5 wt % Cu with the remainder being Bi, or from 0 to 20 wt % Ag and from 0 to 5 wt % Cu, with the remainder being Bi.

22. The method of claim 17, wherein the first solder alloy comprises from 2.6 to 15 wt % Ag with the remainder being Bi, from 0.2 to 1.5 wt % of Cu with the remainder being Bi, or from 2.6 to 1.5 wt % Ag, and from 0.2 to 1.5 wt % Cu with the remainder being Bi.

23. The method of claim 17, wherein the second solder alloy further comprises a second component that has a negative mixing enthalpy with the constituents of the first solder alloy.

24. The method of claim 17, wherein the first solder alloy has a greater wettability to the interfacial intermetallic compound layer than the first solder alloy has to the substrate.

25. The method of claim 17, wherein, during reflow, the interfacial intermetallic compound layer forms after the second solder starts to melt and before the formation of the one or more additional intermetallic compounds inside the joint.

26. The method of claim 25, wherein, during reflow, the interfacial intermetallic layer continues to grow while the one or more additional intermetallic compounds form inside the joint after the first solder alloy starts to melt.

27. The method of claim 17, wherein the second solder comprises a Sn—Sb—X alloy or a Sn—Ag—X alloy.

\* \* \* \* \*